(12) United States Patent
Sharf

(10) Patent No.: US 10,925,182 B2
(45) Date of Patent: Feb. 16, 2021

(54) DUAL HEAT TRANSFER ASSEMBLY FOR A RECEPTACLE ASSEMBLY

(71) Applicant: TE CONNECTIVITY CORPORATION, Berwyn, PA (US)

(72) Inventor: Alex Michael Sharf, Harrisburg, TX (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/516,741

(22) Filed: Jul. 19, 2019

(65) Prior Publication Data

US 2021/0022268 A1    Jan. 21, 2021

(51) Int. Cl.
  *H05K 7/20*    (2006.01)
  *F28F 1/40*    (2006.01)
  *F28D 21/00*   (2006.01)

(52) U.S. Cl.
  CPC .......... *H05K 7/20436* (2013.01); *F28F 1/40* (2013.01); *H05K 7/20009* (2013.01); *F28D 2021/0028* (2013.01)

(58) Field of Classification Search
  CPC .......... H05K 7/20436; H05K 7/20009; H05K 7/20418; H05K 9/0058; H05K 7/2039; F28F 1/40; F28D 2021/0028; G02B 6/4269; G02B 6/4261; G02B 6/4284; G02B 6/4201; G02B 6/428; G02B 6/4268; G02B 6/4266; H01R 13/6587; H01R 13/6594; G06F 1/20; G06F 1/181

USPC ........ 361/703, 704, 715, 702, 818; 439/487, 439/607.25, 357, 607.1

See application file for complete search history.

(56) References Cited

U.S. PATENT DOCUMENTS

| | | | |
|---|---|---|---|
| 9,246,280 B2 | 1/2016 | Neer et al. | |
| 9,583,886 B2 | 2/2017 | Phillips | |
| 9,851,519 B1* | 12/2017 | Van Gaal | G02B 6/4269 |
| 9,910,231 B2 | 3/2018 | Kelty et al. | |
| 2007/0075118 A1* | 4/2007 | Barina | B23K 37/0408 228/44.7 |
| 2008/0019100 A1* | 1/2008 | Yang | H05K 9/0058 361/716 |
| 2016/0197424 A1 | 7/2016 | L'Esperance et al. | |
| 2019/0181582 A1* | 6/2019 | Beltran | H05K 3/00 |

* cited by examiner

*Primary Examiner* — Mandeep S Buttar

(57) ABSTRACT

A dual heat transfer assembly includes upper and lower heat transfer elements received in a separator channel of a port separator of a receptacle cage. The upper heat transfer element includes an upper thermal interface extending into an upper module channel to interface with an upper pluggable module. The lower heat transfer element includes a lower thermal interface extending into a lower module channel of the receptacle cage to interface with a lower pluggable module. The heat transfer elements include inner ends located in the separator channel. The heat transfer elements include biasing members engaging the heat transfer elements and biasing the heat transfer elements into thermal engagement with the pluggable modules.

20 Claims, 6 Drawing Sheets

DUAL HEAT TRANSFER ASSEMBLY FOR A RECEPTACLE ASSEMBLY

BACKGROUND OF THE INVENTION

The subject matter herein relates generally to receptacle assemblies.

Some communication systems utilize receptacle assemblies having communication connectors to interconnect various components of the system for data communication. The receptacle assemblies include receptacle cages that receive pluggable modules, such as I/O modules, that are electrically connected to the communication connector. The receptacle cages provide electrical shielding, such as EMI shielding, for the pluggable modules. The receptacle cages are typically arranged at an interface of another component, such as through an opening in a panel or bezel.

The pluggable modules generate heat during use. However, heat dissipation from the pluggable modules is difficult, particularly for pluggable modules in the lower module channel of the receptacle cage. Conventional receptacle cages typically include a heat sink coupled to the top of the receptacle cage to transfer heat from the pluggable module in the upper module channel of the receptacle cage. However, the heat sink increases the height of the assembly. Additionally, the heat sink at the top of the receptacle cage is only used to transfer heat from the upper pluggable module and does not interface with the lower pluggable module.

A need remains for a receptacle assembly providing heat dissipation for pluggable modules received in the receptacle cage of the receptacle assembly.

BRIEF DESCRIPTION OF THE INVENTION

In one embodiment, a dual heat transfer assembly is provided. The dual heat transfer assembly includes an upper heat transfer element that is received in a separator channel of a port separator of a receptacle cage. The upper heat transfer element includes an upper thermal interface configured to extend into an upper module channel of the receptacle cage to interface with an upper pluggable module and thermally communicate with the upper pluggable module. The upper heat transfer element includes a bottom located in the separator channel of the port separator. The upper heat transfer element includes an upper biasing member engaging the upper heat transfer element and upward biasing the upper heat transfer element into thermal engagement with the upper pluggable module. The dual heat transfer assembly includes a lower heat transfer element that is received in the separator channel of the port separator of the receptacle cage. The lower heat transfer element includes a lower thermal interface configured to extend into a lower module channel of the receptacle cage to interface with a lower pluggable module and thermally communicate with the lower pluggable module. The lower heat transfer element includes a top located in the separator channel of the port separator. The top faces the bottom of the upper heat transfer element. The lower heat transfer element includes a lower biasing member to engage the lower heat transfer element and downward biasing the lower heat transfer element into thermal engagement with the lower pluggable module.

In another embodiment, a receptacle assembly is provided. The receptacle assembly includes a receptacle cage that has cage walls to define a cavity. The receptacle cage includes a front that has an upper port accessing an upper module channel and a lower port accessing a lower module channel. The receptacle cage includes a port separator received in the cavity. The port separator includes an upper wall and a lower wall to define a separator channel between the upper wall and the lower wall. The port separator separates the cavity into the upper module channel above the upper wall configured to receive an upper pluggable module and the lower module channel below the lower wall configured to receive a lower pluggable module. A communication connector is received in the cavity and has an upper mating interface for mating with the upper pluggable module and a lower mating interface for mating with the lower pluggable module. The receptacle assembly includes a dual heat transfer assembly. The deal heat transfer assembly includes an upper heat transfer element and a lower heat transfer element. The upper heat transfer element is received in the separator channel. The upper heat transfer element includes an upper thermal interface that extends into the upper module channel to interface with the upper pluggable module. The upper heat transfer element includes a bottom located in the separator channel. The lower heat transfer element is received in the separator channel. The lower heat transfer element includes a lower thermal interface that extends into the lower module channel to interface with the lower pluggable module. the lower heat transfer element includes a top located in the separator channel facing the bottom of the upper heat transfer element.

In a further embodiment, a communication system is provided. The communication system includes a host circuit board, an upper pluggable module having a shell holding a module circuit board, a lower pluggable module having a shell holding a module circuit board and a receptacle assembly coupled to the host circuit board. The receptacle assembly includes a receptacle cage that has cage walls to define a cavity. The receptacle cage includes a port separator that is received in the cavity to define a separator channel between an upper wall and a lower wall. The port separator separates the cavity into an upper module channel above the upper wall to receive the upper pluggable module and a lower module channel below the lower wall to receive the lower pluggable module. The receptacle assembly includes a communication connector. The communication connector has an upper mating interface for mating with the upper pluggable module and a lower mating interface for mating with the lower pluggable module. The receptacle assembly includes a dual heat transfer assembly that has an upper heat transfer element and a lower heat transfer element. The upper heat transfer element is received in the separator channel. The upper heat transfer element includes an upper thermal interface extending into the upper module channel to interface with the shell of the upper pluggable module. The lower heat transfer element is received in the separator channel. The lower heat transfer element includes a lower thermal interface extending into the lower module channel to interface with the shell of the lower pluggable module.

DETAILED DESCRIPTION OF THE INVENTION

Figure 1:
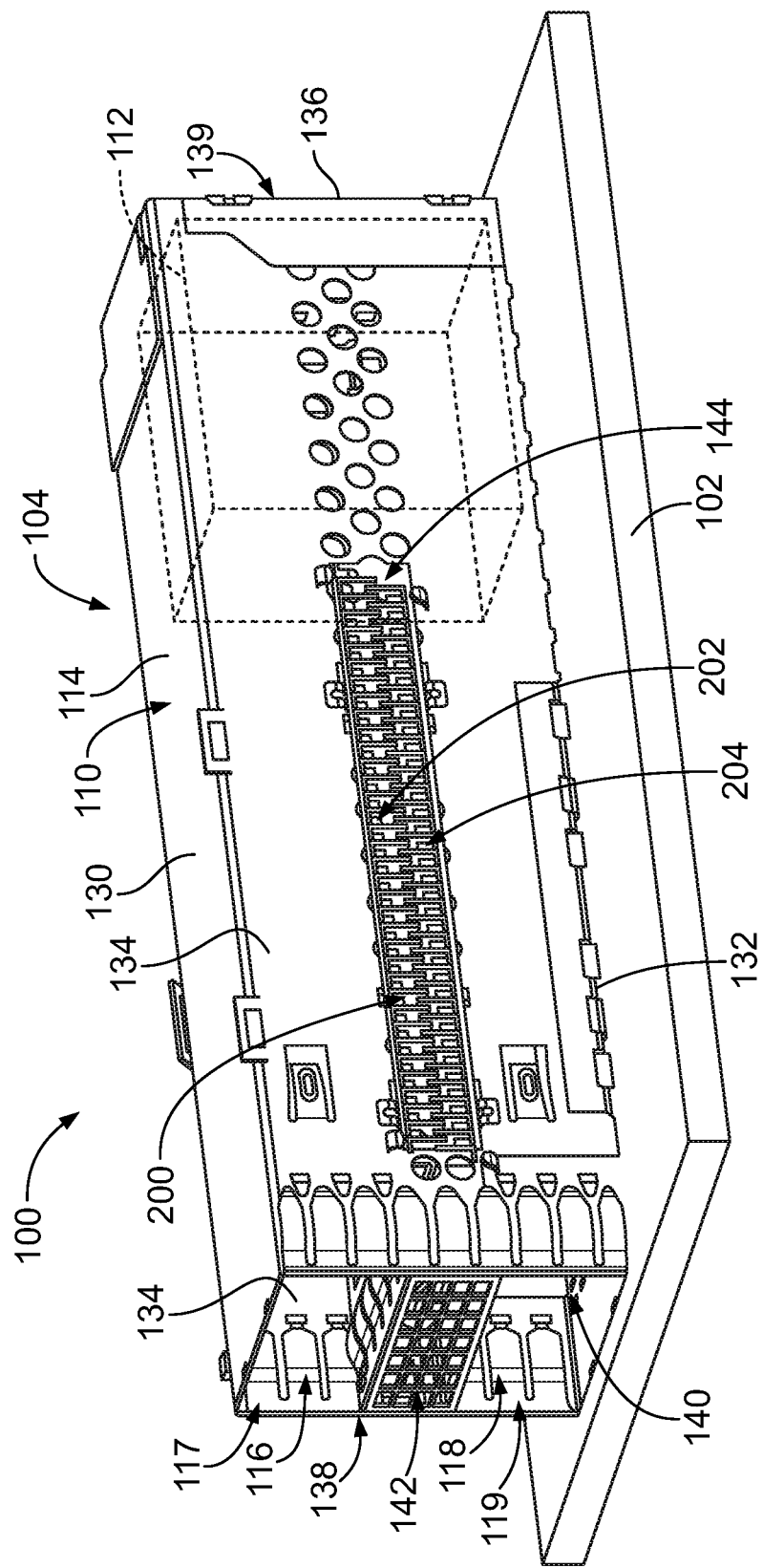
FIG. 1 is a side perspective view of a communication system including a receptacle assembly formed in accordance with an exemplary embodiment.
Figure 2:
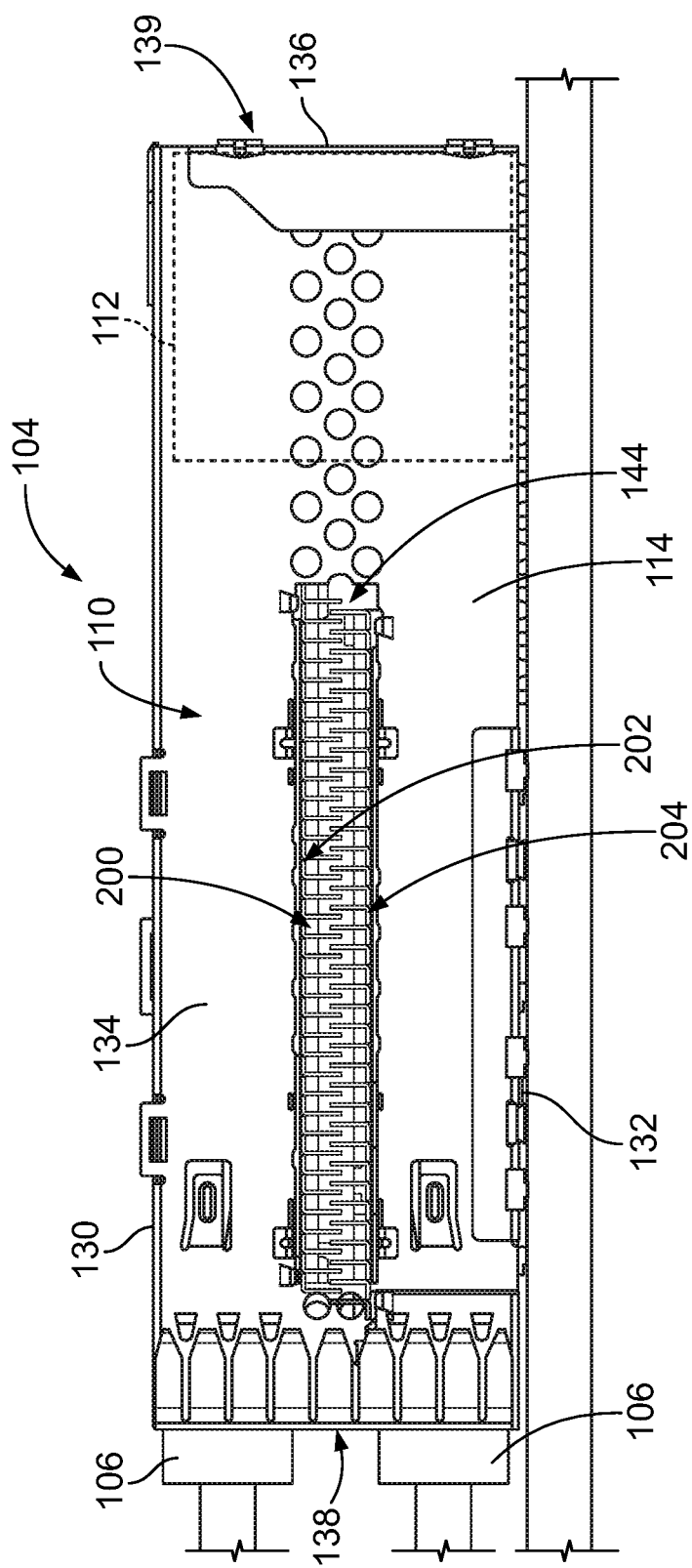
FIG. 2 is a side view of the receptacle assembly of the communication system in accordance with an exemplary embodiment.

FIG. 1 is a side perspective view of a communication system 100 formed in accordance with an exemplary embodiment. FIG. 2 is a side view of the communication system 100 formed in accordance with an exemplary embodiment. The communication system 100 includes a host circuit board 102 and a receptacle assembly 104 mounted to the circuit board 102. Pluggable modules 106 (FIG. 2) are configured to be electrically connected to the receptacle assembly 104. The pluggable modules 106 are electrically connected to the circuit board 102 through the receptacle assembly 104.

In an exemplary embodiment, the receptacle assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 is enclosed and provides electrical shielding for the communication connector 112. The pluggable modules 106 are loaded into the receptacle cage 110 and are at least partially surrounded by the receptacle cage 110. The receptacle cage 110 includes a plurality of cage walls 114 that define one or more module channels for receipt of corresponding pluggable modules 106. The cage walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the cage walls 114 being shielding walls.

In the illustrated embodiment, the receptacle cage 110 constitutes a stacked cage member having an upper module channel 116 (FIG. 1) and a lower module channel 118 (FIG. 1). The receptacle assembly 104 is configured to mate with the pluggable modules 106 in both stacked module channels 116, 118. The receptacle cage 110 has module ports 117, 119 (FIG. 1) that open to the module channels 116, 118, respectively, which receive corresponding upper and lower pluggable modules 106. Any number of module channels may be provided in various embodiments. In the illustrated embodiment, the receptacle cage 110 includes the upper and lower module channels 116, 118 arranged in a single column; however, the receptacle cage 110 may include multiple columns of ganged module channels 116, 118 in alternative embodiments (for example, 2×2, 3×2, 4×2, 4×3, etc.). Optionally, multiple communication connectors 112 may be arranged within the receptacle cage 110, such as when multiple columns of module channels 116 and/or 118 are provided.

In an exemplary embodiment, the cage walls 114 of the receptacle cage 110 include a top wall 130, a bottom wall 132, side walls 134, and a rear wall 136. The bottom wall 132 may rest on the host circuit board 102. However, in alternative embodiments, the receptacle cage 110 may be provided without the bottom wall 132. The receptacle cage 110 extends between a front end 138 and a rear end 139. The module ports 117, 119 are provided at the front end 138 and receive the pluggable modules 106 through the front end 138. The cage walls 114 define a cavity 140. For example, the cavity 140 may be defined by the top wall 130, the bottom wall 132, the side walls 134, and the rear wall 136. Other cage walls 114 may separate or divide the cavity 140 into the various module channels 116, 118. For example, the cage walls 114 include a port separator 142 between the upper and lower module channels 116, 118. The port separator 142 forms a space between the upper and lower module channels 116, 118, such as for airflow for cooling the pluggable modules 106. In other various embodiments, the cage walls 114 may include vertical separator panels (not shown), such as parallel to the side walls 134, between ganged module channels 116 and/or 118.

The receptacle assembly 104 includes a dual heat transfer assembly 200 for dissipating heat from the pluggable modules 106. In an exemplary embodiment, the dual heat transfer assembly 200 includes an upper heat transfer element 202 and a lower heat transfer element 204. The upper heat transfer element 202 is configured to thermally engage the upper pluggable module 106 received in the upper module channel 116. The lower heat transfer element 204 is configured to thermally engage the lower pluggable module 106 received in the lower module channel 118. In various embodiments, the heat transfer elements 202, 204 are finned heat sinks. In other various embodiments, the heat transfer elements 202, 204 may include or be thermally coupled to another heat transfer member, such as heat spreaders, cold plates, heat pipes having liquid cooling pipes or channels, and the like. The lower heat transfer element 204 may define a heat transfer member for the upper heat transfer element 202 and/or the upper heat transfer element 202 may define a heat transfer member for the lower heat transfer element 204. The heat transfer elements 202, 204 are received in the port separator 142 between the upper and lower module channels 116, 118. The heat transfer elements 202, 204 may extend through openings in the port separator 142 to directly engage the pluggable modules 106. In an exemplary embodiment, the receptacle cage 110 includes airflow openings 144 in the side walls 134 and/or at the front end 138 to promote airflow through the port separator 142 to dissipate heat from the heat transfer elements 202, 204.

The communication connector 112 is coupled to the circuit board 102. The receptacle cage 110 is mounted to the circuit board 102 over the communication connector 112. In an exemplary embodiment, the communication connector 112 is received in the cavity 140, such as proximate to the rear wall 136. However, in alternative embodiments, the communication connector 112 may be located behind the rear wall 136 exterior of the receptacle cage 110 and extend into the cavity 140 to interface with the pluggable module(s) 106. For example, the rear wall 136 may include an opening to receive components therethrough. In an exemplary embodiment, a single communication connector 112 is used to electrically connect with the pair of stacked pluggable modules 106 in the upper and lower module channels 116, 118. In alternative embodiments, the communication system 100 may include discrete, stacked communication connectors 112 (for example, an upper communication connector and a lower communication connector) for mating with the corresponding pluggable modules 106.

In an exemplary embodiment, the pluggable modules 106 are loaded into the receptacle cage 110 through the front end 138 to mate with the communication connector 112. The shielding cage walls 114 of the receptacle cage 110 provide electrical shielding around the communication connector 112 and the pluggable modules 106, such as around the mating interfaces between the communication connector 112 and the pluggable modules 106.

Figure 3:
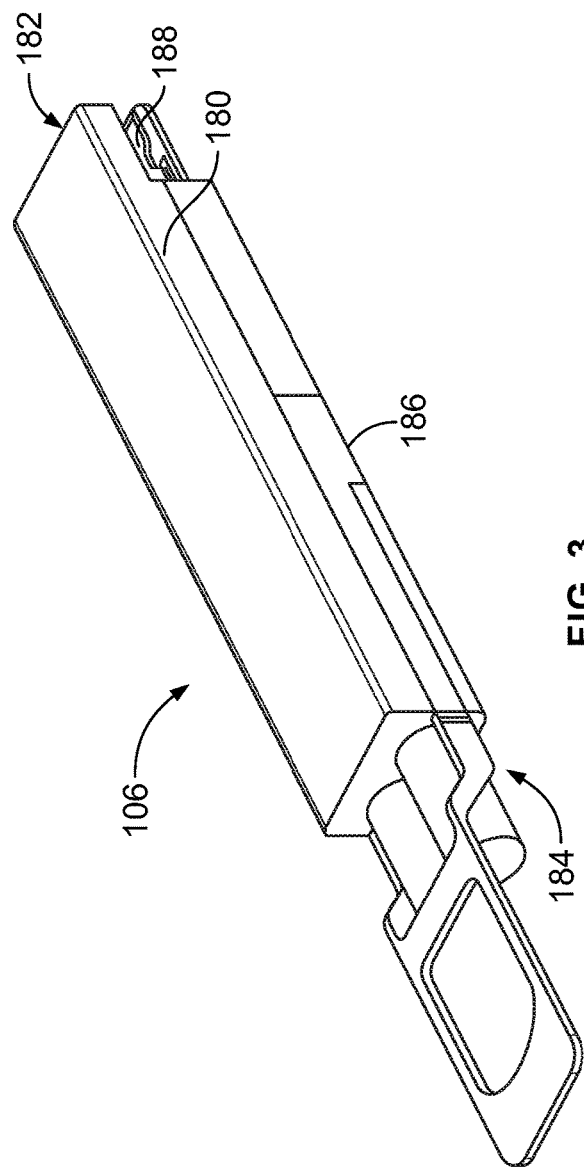
FIG. 3 is a front perspective view of a pluggable module of the communication system in accordance with an exemplary embodiment.

FIG. 3 is a front perspective view of the pluggable module 106 in accordance with an exemplary embodiment. The pluggable module 106 has a pluggable body 180, which may be defined by one or more shells. The pluggable body 180 includes sides, a top, and a bottom. The pluggable body 180 may be thermally conductive and/or may be electrically conductive, such as to provide EMI shielding for the pluggable module 106. The pluggable body 180 includes a mating end 182 and an opposite front end 184. The front end 184 may be a cable end having a cable extending therefrom to another component within the system. The mating end 182 is configured to be inserted into the corresponding module channel 116 or 118 (shown in FIG. 1).

The pluggable module 106 includes a module circuit board 188 that is configured to be communicatively coupled to the communication connector 112 (shown in FIG. 1). The module circuit board 188 may be accessible at the mating end 182. The module circuit board 188 may include components, circuits and the like used for operating and/or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits.

In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a thermal interface 186 configured to engage the corresponding heat transfer element 202, 204 (shown in FIG. 1). The thermal interface 186 may be along the top, such as when the pluggable module 106 is received in the lower module channel 118. The thermal interface 186 may be along the bottom, such as when the pluggable module 106 is received in the upper module channel 116. The pluggable body 180 may include heat transfer fins that transfer heat away from the main shell of the pluggable body 180.

Figure 4:
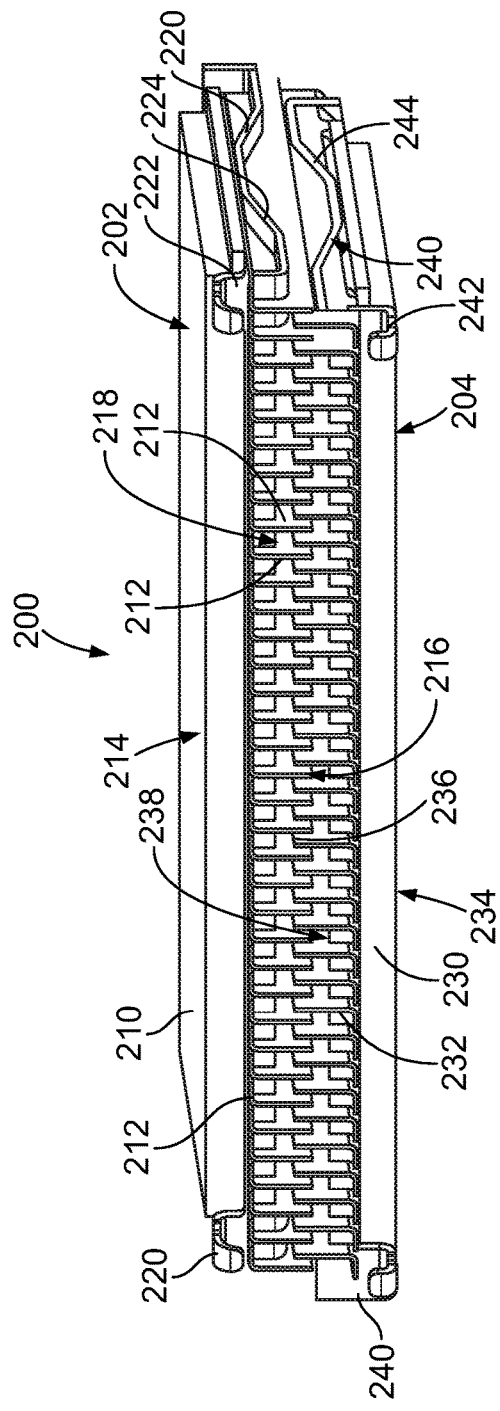
FIG. 4 is a side perspective view of a dual heat transfer assembly of the receptacle assembly in accordance with an exemplary embodiment.

FIG. 4 is a side perspective view of the dual heat transfer assembly 200 in accordance with an exemplary embodiment. The dual heat transfer assembly 200 includes the upper heat transfer element 202 and the lower heat transfer element 204. The upper heat transfer element 202 is movable relative to the lower heat transfer element 204.

The upper heat transfer element 202 includes an upper base 210 and upper heat dissipating fins 212 extending from the upper base 210. In an exemplary embodiment, the base 210 is a thermally conductive block, such as a metal block. The base 210 includes an upper thermal interface 214 configured to interface with the upper pluggable module 106 (shown in FIG. 1) and dissipate heat from the upper pluggable module 106. The heat dissipating fins 212 are located opposite the upper thermal interface 214 at an inner end 216 (e.g., a bottom) of the upper heat transfer element 202.

The upper heat dissipating fins 212 are separated by upper fin channels 218. In the illustrated embodiment, the heat dissipating fins 212 and the fin channels 218 extend side-to-side across the lateral width of the upper heat transfer element 202. In alternative embodiments, the heat dissipating fins 212 and the fin channels 218 extend end-to-end along the longitudinal length of upper heat transfer element 202. In various embodiments, the heat dissipating fins 212 may be separate and discrete from the base 210. For example, the heat dissipating fins 212 may be stamped and formed plates coupled to the base 210. In the illustrated embodiment, the heat dissipating fins 212 are L-shaped plates having a base section extending along the base 210 and an end section extending downward from the base 210. Optionally, each of the heat dissipating fins 212 are separate and discrete from each other. Alternatively, the heat dissipating fins 212 may be integral with each other, such as being stamped and formed from a single sheet of metal. In various embodiments, the heat dissipating fins 212 may be soldered to the base 210. In other various embodiments, the heat dissipating fins 212 may be bonded to the base 210, such as using a thermally conductive epoxy. Alternatively, the heat dissipating fins 212 may be integral with the base 210, such as being extruded with the base 210 or skived from the base 210.

The dual heat transfer assembly 200 includes one or more upper biasing members 220 engaging the upper heat transfer element 202. The upper biasing member 220 is configured to preload or upward bias the upper heat transfer element 202 into thermal engagement with the upper pluggable module 106. The upper biasing member 220 is configured to be coupled to the receptacle cage 110 and support the upper heat transfer element 202 relative to the receptacle cage 110. In various embodiments, the upper biasing member 220 is a stamped and formed clip manufactured from a metal material. In other various embodiments, the upper biasing member 220 may be a plastic clip. The upper biasing member 220 may be another type of biasing element in alternative embodiments.

The upper biasing member 220 includes a mounting arm 222 configured to be coupled to the receptacle cage 110 and a biasing arm 224 extending from the mounting arm 222. The biasing arm 224 engages the upper heat transfer element 202. The biasing arm 224 is spring biased against the upper heat transfer element 202 to force the upper heat transfer element 202 in an upward direction (e.g., into thermal engagement with the upper pluggable module 106). When the upper pluggable module 106 engages the upper thermal interface 214 of the upper heat transfer element 202, the upper heat transfer element 202 is pushed downward against the biasing arm 224 and compresses the upper biasing member 220 thus loading the upper biasing member 220 against the upper heat transfer element 202. The upper biasing member 220 presses the upper thermal interface 214 into thermal engagement with the upper pluggable module 106.

Optionally, upper biasing members 220 may be provided at each end of the upper heat transfer element 202. In alternative embodiments, a single upper biasing member 220 is provided having mounting arms 222 and biasing arms 224. In various embodiments, the biasing arms 224 may be provided at each end of the upper heat transfer element 202. In various embodiments, the upper biasing member(s) 220 may engage the side(s) of the upper heat transfer element 202 in addition to or in the alternative to engaging the ends of the upper heat transfer element 202.

The lower heat transfer element 204 includes a lower base 230 and lower heat dissipating fins 232 extending from the lower base 230. In an exemplary embodiment, the base 230 is a thermally conductive block, such as a metal block. The base 230 includes a lower thermal interface 234 configured to interface with the lower pluggable module 106 (shown in FIG. 1) and dissipate heat from the lower pluggable module 106. The heat dissipating fins 232 are located opposite the lower thermal interface 234 at an inner end 236 (e.g., a top) of the lower heat transfer element 202.

The lower heat dissipating fins 232 are separated by lower fin channels 238. In the illustrated embodiment, the heat dissipating fins 232 and the fin channels 238 extend side-to-side across the lateral width of the lower heat transfer element 202. In alternative embodiments, the heat dissipating fins 232 and the fin channels 238 extend end-to-end along the longitudinal length of lower heat transfer element 202. In various embodiments, the heat dissipating fins 232 may be separate and discrete from the base 230. For example, the heat dissipating fins 232 may be stamped and formed plates coupled to the base 230. In the illustrated embodiment, the heat dissipating fins 232 are L-shaped plates having a base section extending along the base 230 and an end section extending downward from the base 230. Optionally, each of the heat dissipating fins 232 are separate and discrete from each other. Alternatively, the heat dissipating fins 232 may be integral with each other, such as being stamped and formed from a single sheet of metal. In various embodiments, the heat dissipating fins 232 may be soldered to the base 230. In other various embodiments, the heat dissipating fins 232 may be bonded to the base 230, such as using a thermally conductive epoxy. Alternatively, the heat dissipating fins 232 may be integral with the base 230, such as being extruded with the base 230 or skived from the base 230.

The dual heat transfer assembly 200 includes a lower biasing member 240 engaging the lower heat transfer element 204. The lower biasing member 240 is configured to preload or downward bias the lower heat transfer element 204 into thermal engagement with the lower pluggable module 106. The lower biasing member 240 is configured to be coupled to the receptacle cage 110 and support the lower heat transfer element 204 relative to the receptacle cage 110. In various embodiments, the lower biasing member 240 is a stamped and formed clip manufactured from a metal material. In other various embodiments, the lower biasing member 240 may be a plastic clip.

The lower biasing member 240 includes a mounting arm 242 configured to be coupled to the receptacle cage 110 and a biasing arm 244 extending from the mounting arm 242. The biasing arm 244 engages the lower heat transfer element 204. The biasing arm 244 is spring biased against the lower heat transfer element 204 to force the lower heat transfer element 204 in a downward direction (e.g., into thermal engagement with the lower pluggable module 106). When the lower pluggable module 106 engages the lower thermal interface 234 of the lower heat transfer element 204, the lower heat transfer element 204 is pushed upward against the biasing arm 244 and compresses the lower biasing member 240 thus loading the lower biasing member 240 against the lower heat transfer element 204. The lower biasing member 240 presses the lower thermal interface 234 into thermal engagement with the lower pluggable module 106.

Optionally, lower biasing members 240 may be provided at each end of the lower heat transfer element 202. In alternative embodiments, a single lower biasing member 240 is provided having mounting arms 242 and biasing arms 244. In various embodiments, the biasing arms 244 may be provided at each end of the lower heat transfer element 202. In other various embodiments, the lower biasing member(s) 240 may engage the side(s) of the lower heat transfer element 202 in addition to or in the alternative to engaging the ends of the lower heat transfer element 202. In various embodiments, the lower biasing member(s) 240 may be integral with the upper biasing member(s) 220, such as being stamped and formed with the upper biasing member(s) 220.

Figure 5:
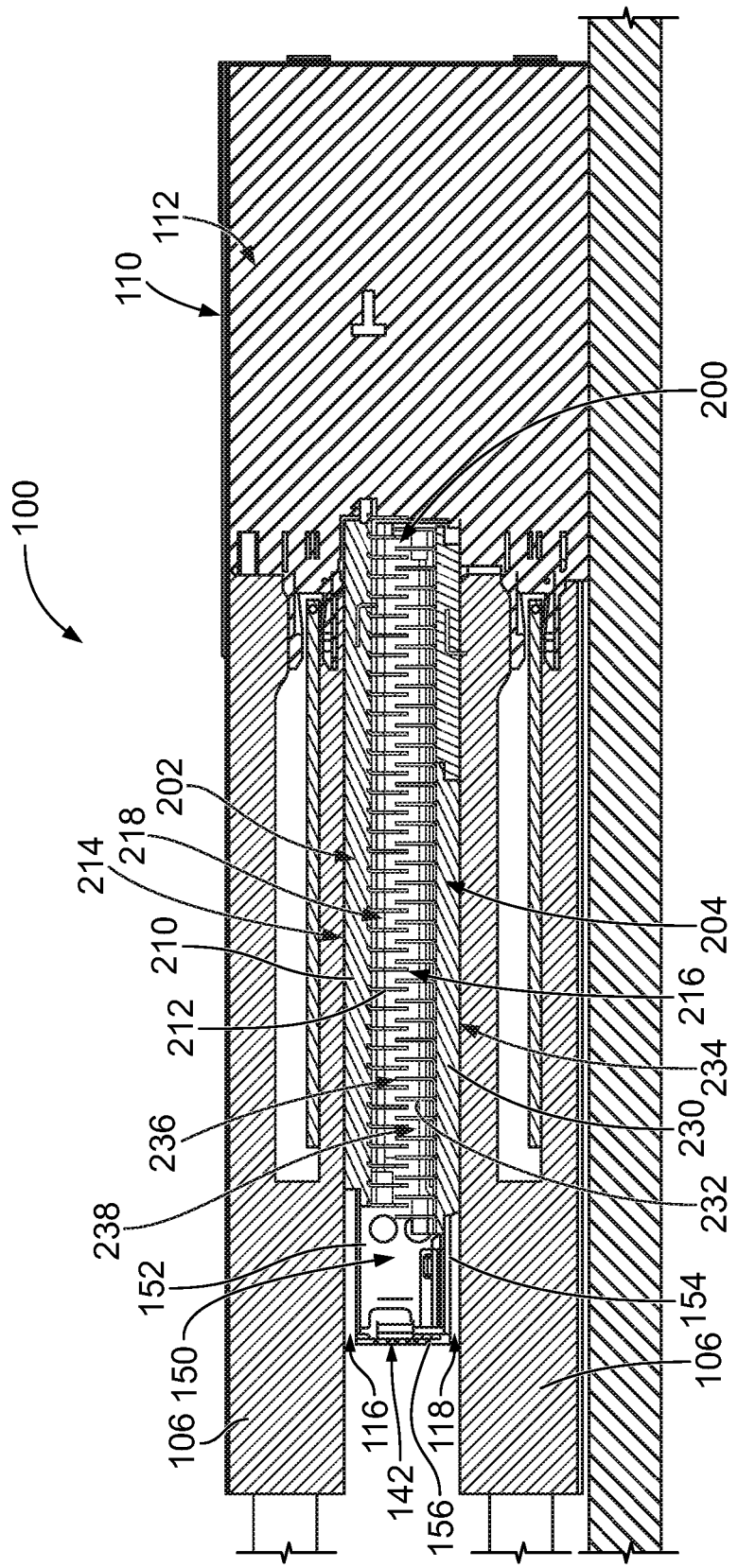
FIG. 5 is a cross-sectional view of the receptacle assembly of the communication system in accordance with an exemplary embodiment.

FIG. 5 is a cross-sectional view of the communication system 100 in accordance with an exemplary embodiment. FIG. 5 illustrates the communication connector 112 and the dual heat transfer assembly 200 received in the receptacle cage 110. The communication connector 112 is located at the rear end of the receptacle cage 110 rearward of the upper and lower module channels 116, 118. FIG. 5 illustrates the upper and lower pluggable modules 106 loaded into the corresponding upper and lower module channels 116, 118 connected to the communication connector 112. The dual heat transfer assembly 200 is thermally coupled to the upper and lower pluggable modules 106. The upper heat transfer element 202 is thermally coupled to the bottom of the upper pluggable module 106 and the lower heat transfer element 204 is thermally coupled to the top of the lower pluggable module 106.

The dual heat transfer assembly 200 is received in a separator channel 150 of the port separator 142. The port separator 142 includes an upper wall 152 and a lower wall 154 with a front wall 156 between the upper wall 152 and the lower wall 154. The separator channel 150 is located between the upper wall 152 and the lower wall 154 rearward of the front wall 156.

The upper heat transfer element 202 is coupled to the upper wall 152. The upper thermal interface 214 of the base 210 extends into the upper module channel 116 of the receptacle cage 110 to interface with the upper pluggable module 106 and dissipate heat from the upper pluggable module 106. The bottom or inner end 216 of the upper heat transfer element 202 is located in the separator channel 150 of the port separator 142. The heat dissipating fins 212 are located in the separator channel 150 and face the lower heat transfer element 204.

The lower heat transfer element 204 is coupled to the lower wall 154. The lower thermal interface 234 of the base 230 extends into the lower module channel 118 of the receptacle cage 110 to interface with the lower pluggable module 106 and dissipate heat from the lower pluggable module 106. The top or inner end 236 of the lower heat transfer element 204 is located in the separator channel 150 of the port separator 142. The lower heat dissipating fins 232 are located in the separator channel 150 and face the lower heat transfer element 204. In an exemplary embodiment, the lower heat dissipating fins 232 are internested with the upper heat dissipating fins 212. For example, the upper heat dissipating fins 212 are received in the lower fin channels 238 and the lower heat dissipating fins 232 are received in the upper fin channels 218.

In an exemplary embodiment, the heat transfer elements 202, 204 are movable within the separator channel 150 relative to the upper and lower walls 152, 154. The upper heat transfer element 202 is movable relative to the lower heat transfer element 204. For example, the upper heat dissipating fins 212 may be moved within the lower fin channels 238 (for example, moved up and down within the lower fin channels 238) and the lower heat dissipating fins 232 may be moved within the upper fin channels 218 (for example, moved up and down within the upper fin channels 218).

In an exemplary embodiment, air is able to flow through the separator channel 150, such as side to side through the separator channel 150. For example, the side walls 134 of the receptacle cage 110 may include openings to allow airflow through the separator channel 150. The air flows through the fin channels 218, 238 to cool the heat dissipating fins 212, 232. Heat is dissipated from both the upper and lower pluggable modules 106 by the dual heat transfer assembly 200. In an exemplary embodiment, the dual heat transfer assembly 200 has a low profile fitting within the port separator 142 so as to not increase in overall height of the receptacle cage 110.

Figure 6:
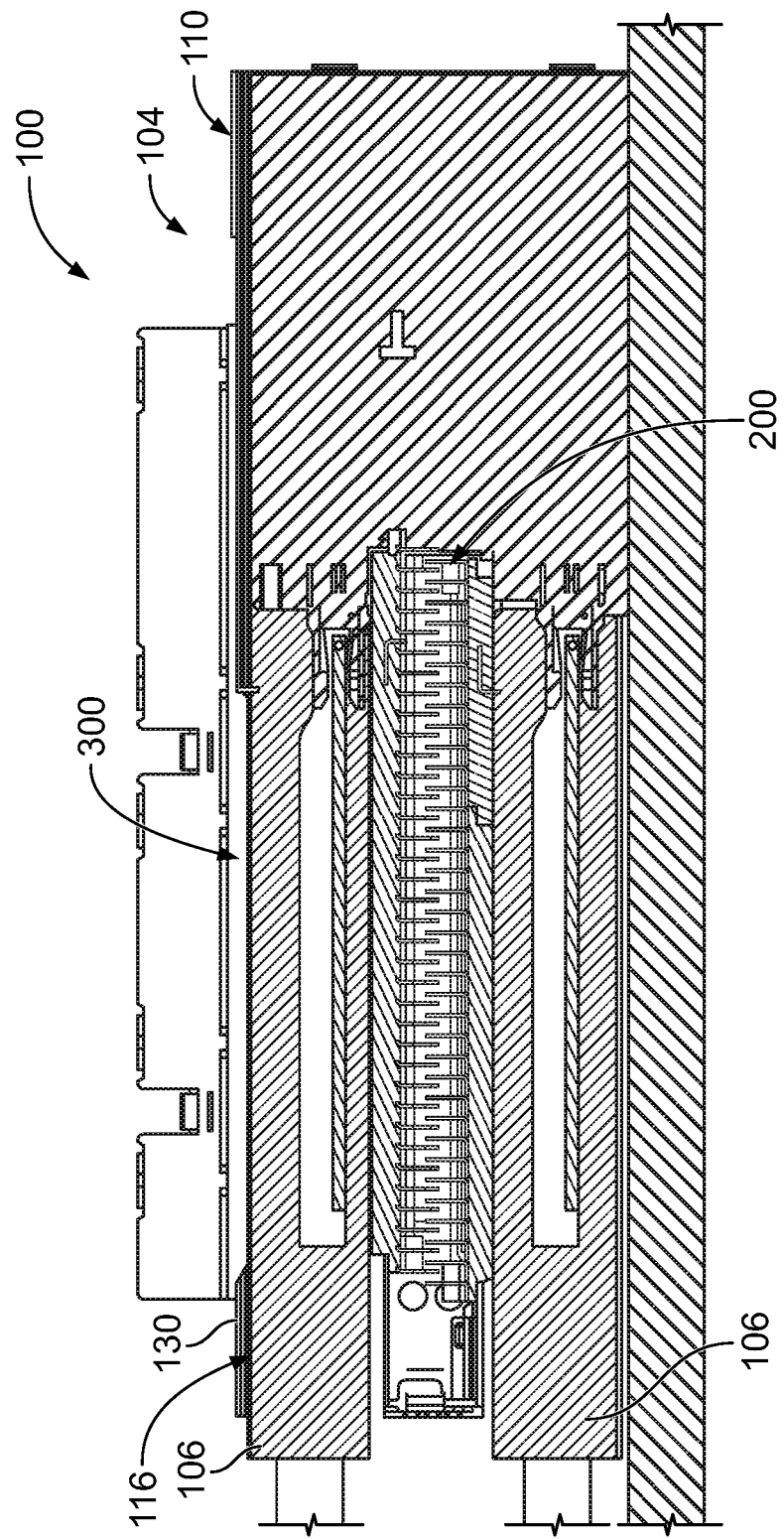
FIG. 6 is a cross-sectional view of the communication system in accordance with an exemplary embodiment.
Figure 7:
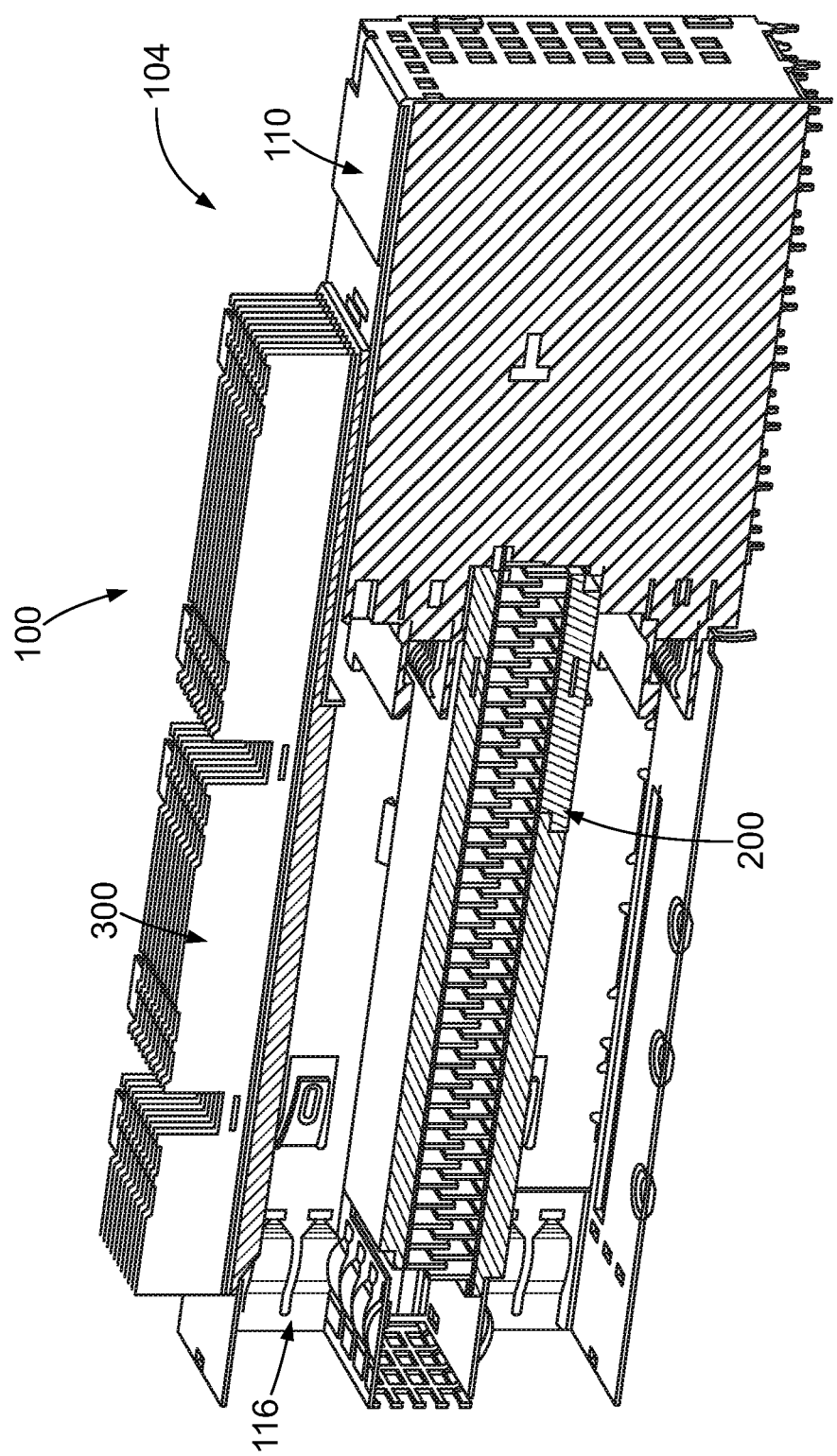
FIG. 7 is a rear perspective, partial sectional view of the communication system in accordance with an exemplary embodiment.

FIG. 6 is a cross-sectional view of the communication system 100 in accordance with an exemplary embodiment. FIG. 7 is a rear perspective, partial sectional view of the communication system 100 in accordance with an exemplary embodiment. FIGS. 6 and 7 illustrate the receptacle assembly 104 including the dual heat transfer assembly 200 and further including an upper heat transfer assembly 300 coupled to the top wall 130 of the receptacle cage 110. In the illustrated embodiment, the upper heat transfer assembly 300 is a riding heat sink extending into the upper module channel 116 to engage the top of the upper pluggable module 106. The upper heat transfer assembly 300 provides further cooling for the upper pluggable module 106.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A dual heat transfer assembly comprising:
   an upper heat transfer element received in a separator channel of a port separator of a receptacle cage, the upper heat transfer element including an upper thermal interface configured to extend into an upper module channel of the receptacle cage to interface with an upper pluggable module and thermally communicate with the upper pluggable module, the upper heat transfer element including a bottom located in the separator channel of the port separator, the upper heat transfer element including an upper biasing member engaging the upper heat transfer element and upward biasing the upper heat transfer element into thermal engagement with the upper pluggable module, wherein the upper heat transfer element includes an upper heat sink having upper heat dissipating fins, the upper heat dissipating fins being located in the separator channel; and
   a lower heat transfer element received in the separator channel of the port separator of the receptacle cage, the lower heat transfer element including a lower thermal interface configured to extend into a lower module channel of the receptacle cage to interface with a lower pluggable module and thermally communicate with the lower pluggable module, the lower heat transfer element including a top located in the separator channel of the port separator, the top facing the bottom of the upper heat transfer element, the lower heat transfer element including a lower biasing member engaging the lower heat transfer element and downward biasing the lower heat transfer element into thermal engagement with the lower pluggable module, wherein the lower heat transfer element including a lower heat sink having lower heat dissipating fins, the lower heat dissipating fins being located in the separator channel.

2. The dual heat transfer assembly of claim 1, wherein the upper heat transfer element is movable within the separator channel and the lower heat transfer element is movable within the separator channel.

3. The dual heat transfer assembly of claim 1, wherein the upper heat transfer element is movable relative to the lower heat transfer element.

4. The dual heat transfer assembly of claim 1, wherein the upper biasing member is configured to be coupled to the receptacle cage and supports the upper heat transfer element relative to the receptacle cage, and wherein the lower biasing member is configured to be coupled to the receptacle cage and supports the lower heat transfer element relative to the receptacle cage.

5. The dual heat transfer assembly of claim 1, wherein the upper biasing member includes a mounting arm configured to be coupled to the receptacle cage and a biasing arm engaging the upper heat transfer element and being spring biased against the upper heat transfer element to force the upper heat transfer element in an upward direction, and wherein the lower biasing member includes a mounting arm configured to be coupled to the receptacle cage and a biasing arm engaging the lower heat transfer element and being spring biased against the lower heat transfer element to force the lower heat transfer element in a downward direction.

6. The dual heat transfer assembly of claim 1, wherein the upper heat dissipating fins are internested with the lower heat dissipating fins.

7. The dual heat transfer assembly of claim 1, wherein the upper heat dissipating fins are separated by upper fin channels, the lower heat dissipating fins being separated by lower fin channels, the upper heat dissipating fins being received in the lower fin channels, the lower heat dissipating fins being received in the upper fin channels.

8. The dual heat transfer assembly of claim 1, wherein the upper heat transfer element includes an upper heat sink located in the separator channel in thermal communication with a heat transfer member, and wherein the lower heat transfer element includes a lower heat sink located in the separator channel in thermal communication with a heat transfer member.

9. A receptacle assembly comprising:

a receptacle cage having cage walls defining a cavity, the receptacle cage including a front having an upper port accessing an upper module channel and a lower port accessing a lower module channel, the receptacle cage including a port separator received in the cavity, the port separator including an upper wall and a lower wall defining a separator channel between the upper wall and the lower wall, the port separator separating the cavity into the upper module channel above the upper wall configured to receive an upper pluggable module and the lower module channel below the lower wall configured to receive a lower pluggable module;

a communication connector received in the cavity having an upper mating interface for mating with the upper pluggable module and a lower mating interface for mating with the lower pluggable module; and a dual heat transfer assembly comprising an upper heat transfer element and a lower heat transfer element, the upper heat transfer element received in the separator channel, the upper heat transfer element including an upper thermal interface extending into the upper module channel to interface with the upper pluggable module, the upper heat transfer element including a bottom located in the separator channel, the lower heat transfer element received in the separator channel, the lower heat transfer element including a lower thermal interface extending into the lower module channel to interface with the lower pluggable module, the lower heat transfer element including a top located in the separator channel facing the bottom of the upper heat transfer element, wherein the upper heat transfer element includes an upper heat sink having upper heat dissipating fins, the upper heat dissipating fins being located in the separator channel, the lower heat transfer element including a lower heat sink having lower heat dissipating fins, the lower heat dissipating fins being located in the separator channel.

10. The receptacle assembly of claim 9, wherein the upper heat transfer element is movable within the separator channel and the lower heat transfer element is movable within the separator channel, the upper heat transfer element being movable relative to the lower heat transfer element.

11. The receptacle assembly of claim 9, wherein the upper biasing member is coupled to the receptacle cage and supports the upper heat transfer element relative to the receptacle cage, and wherein the lower biasing member is coupled to the receptacle cage and supports the lower heat transfer element relative to the receptacle cage.

12. The receptacle assembly of claim 9, wherein the upper heat dissipating fins are internested with the lower heat dissipating fins.

13. The receptacle assembly of claim 9, wherein the upper heat dissipating fins are separated by upper fin channels, the lower heat dissipating fins being separated by lower fin channels, the upper heat dissipating fins being received in the lower fin channels, the lower heat dissipating fins being received in the upper fin channels.

14. The receptacle assembly of claim 9, wherein the upper heat transfer element includes an upper heat sink located in the separator channel in thermal communication with a heat transfer member, and wherein the lower heat transfer element includes a lower heat sink located in the separator channel in thermal communication with a heat transfer member.

15. An communication system comprising:

a host circuit board;

an upper pluggable module having a shell holding a module circuit board;

a lower pluggable module having a shell holding a module circuit board; and a receptacle assembly coupled to the host circuit board, the receptacle assembly comprising a receptacle cage having cage walls defining a cavity, the receptacle cage including a port separator received in the cavity defining a separator channel between an upper wall and a lower wall, the port separator separating the cavity into an upper module channel above the upper wall receiving the upper pluggable module and a lower module channel below the lower wall receiving the lower pluggable module, the receptacle assembly comprising a communication connector, the communication connector having an upper mating interface for mating with the upper pluggable module and a lower mating interface for mating with the lower pluggable module, the receptacle assembly comprising a dual heat transfer assembly having an upper heat transfer element and a lower heat transfer element, the upper heat transfer element received in the separator channel, the upper heat transfer element including an upper thermal interface extending into the upper module channel to interface with the shell of the upper pluggable module, the upper heat transfer element including an upper heat sink having upper heat dissipating fins, the upper heat dissipating fins being located in the separator channel, the lower heat transfer element received in the separator channel, the lower heat transfer element including a lower thermal interface extending into the lower module channel to interface with the shell of the lower pluggable module, the lower heat transfer element including a lower heat sink having lower heat dissipating fins, the lower heat dissipating fins being located in the separator channel.

16. The communication system of claim 15, wherein the upper heat transfer element is movable within the separator channel and the lower heat transfer element is movable within the separator channel, the upper heat transfer element being movable relative to the lower heat transfer element.

17. The communication system of claim 15, wherein the upper biasing member is coupled to the receptacle cage and supports the upper heat transfer element relative to the receptacle cage, and wherein the lower biasing member is coupled to the receptacle cage and supports the lower heat transfer element relative to the receptacle cage.

18. The communication system of claim 15, wherein the upper heat dissipating fins are separated by upper fin channels, the lower heat dissipating fins being separated by lower fin channels, the upper heat dissipating fins being received in the lower fin channels, the lower heat dissipating fins being received in the upper fin channels.

19. The communication system of claim 15, wherein the upper heat dissipating fins are internested with the lower heat dissipating fins.

20. The communication system of claim 15, wherein the upper heat transfer element includes an upper heat sink located in the separator channel in thermal communication with a heat transfer member, and wherein the lower heat transfer element includes a lower heat sink located in the separator channel in thermal communication with a heat transfer member.

* * * * *